United States Patent
Ninomiya

(10) Patent No.: US 6,774,408 B2
(45) Date of Patent: Aug. 10, 2004

(54) TRENCH GATE POWER DEVICE HAVING A CONCENTRATION AT CHANNEL LAYER HIGHER THAN A BASE LAYER AND UNIFORMLY DISTRIBUTED ALONG THE DEPTH OF THE TRENCH AND ITS MANUFACTURING METHOD

(75) Inventor: Hideaki Ninomiya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 10/183,454

(22) Filed: Jun. 28, 2002

(65) Prior Publication Data

US 2003/0003637 A1 Jan. 2, 2003

(30) Foreign Application Priority Data

Jun. 29, 2001 (JP) ........................................ 2001-198551

(51) Int. Cl.[7] ........................ H01L 29/78; H01L 21/8224
(52) U.S. Cl. ........................ 257/136; 257/264; 257/330; 438/206; 438/268
(58) Field of Search ................................. 257/135–136, 257/262–264, 328–330; 438/206, 212, 268

(56) References Cited

U.S. PATENT DOCUMENTS

| 4,983,535 | A | * | 1/1991 | Blanchard | 438/270 |
|---|---|---|---|---|---|
| 5,883,402 | A | * | 3/1999 | Omura et al. | 257/146 |
| 5,894,149 | A | * | 4/1999 | Uenishi et al. | 257/331 |
| 6,153,896 | A | * | 11/2000 | Omura et al. | 257/139 |
| 6,359,306 | B1 | * | 3/2002 | Ninomiya | 257/328 |
| 6,400,026 | B1 | * | 6/2002 | Andou et al. | 257/771 |
| 6,566,691 | B1 | * | 5/2003 | Inoue et al. | 257/139 |
| 6,650,001 | B2 | * | 11/2003 | Yamaguchi et al. | 257/557 |
| 2002/0038887 | A1 | * | 4/2002 | Ninomiya et al. | 257/336 |
| 2002/0179950 | A1 | * | 12/2002 | Hijzen et al. | 257/301 |
| 2003/0203573 | A1 | * | 10/2003 | Nakamura et al. | 438/259 |

FOREIGN PATENT DOCUMENTS

| JP | 09-129868 | * | 5/1997 | ........... H01L/29/78 |
|---|---|---|---|---|
| JP | 09-213939 | * | 8/1997 | ........... H01L/29/78 |
| JP | 10-032331 | * | 2/1998 | ........... H01L/29/78 |
| JP | 11-103052 | | 4/1999 | |
| JP | 2000-150664 | * | 5/2000 | ....... H01L/21/8234 |
| JP | 2001-274400 | * | 10/2001 | ........... H01L/29/78 |
| JP | 2003-017699 | * | 1/2003 | ........... H01L/29/78 |

* cited by examiner

Primary Examiner—Wael Fahmy
Assistant Examiner—Anh Duy Mai
(74) Attorney, Agent, or Firm—Oblon, Spivak, McClelland, Maier & Neustadt, P.C.

(57) ABSTRACT

In a trench MOS gate structure of a semiconductor device where trenches (T) are located between an n-type base layer (1) and an n-type source layer (3), a p-type channel layer (12) is formed adjacent to side walls of the trenches, having an even concentration distribution along a depthwise dimension of the trenches. The p-type channel layer enables saturation current to decrease without a raise of ON-resistance of the device, and resultantly a durability against short-circuit can be enhanced. The n-type source layer formed adjacent to the side walls of the trench also further enhances the durability against short-circuit. Providing contacts of the emitter electrode (7) with the n-type source layer at the side walls of the trenches permits a miniaturization of the device and a reduction of the ON-resistance as well.

21 Claims, 12 Drawing Sheets

TRENCH GATE POWER DEVICE HAVING A CONCENTRATION AT CHANNEL LAYER HIGHER THAN A BASE LAYER AND UNIFORMLY DISTRIBUTED ALONG THE DEPTH OF THE TRENCH AND ITS MANUFACTURING METHOD

CROSS-REFERENCE TO RELATED APPLICATIONS

This application is based upon and claims the benefit of priority from the prior Japanese Patent Application No. 2001-198551, filed on Jun. 29, 2001; the entire contents of which are incorporated herein by reference.

BACKGROUND OF THE INVENTION

The present invention relates to a semiconductor device and its manufacturing method, and more particularly, it relates to a trench MOS (Metal-Oxide-Semiconductor) gate structure and a method of manufacturing it.

A trench structure where trenches formed in semiconductor are utilized is applied to semiconductor devices such as IGBT (Insulated Gate Bipolar Transistor) and MOSFET (Metal Oxide Semiconductor Field Effect Transistor), and the structure has been recognized as being advantageous especially for a use in relation with supply and control of electric power. For instance, IGBT of the trench structure has both the properties of high level input impedance peculiar to MOSFETs and low saturation voltage unique to bipolar transistors, and it has been used in a wide range including blackout-free power supply, various motor driver unit, and so forth.

FIG. 13 is a perspective view showing a vertical IGBT having a trench gate structure which was attempted by the Inventor of the present invention in the course of attaining this invention. A structure in FIG. 13 of the trench IGBT will be outlined in terms of its manufacturing process.

First, a p-type base layer 102 is formed in the surface of an n-type base layer 101 by means of diffusion, and the resultant surface is selectively superposed with an n-type source layer 103 by diffusion. Then, after trenches T for MOS gates are formed, they are covered with a gate insulation film 104 and embedded with gate electrodes 105, which is further superimposed with an insulation film 111 to isolate the gate electrodes at their respective tops. After that, windows are formed to create open contact regions, and then, an emitter electrode 107 is created at the top. In the reverse or bottom side of the integrated substrate, a collector electrode 109 underlies a p-type emitter layer 108 to attain a trench-type IGBT structure.

In the trench MOS gate structure obtained in this manner, the n-type source layer 103 is shaped in a lattice pattern so as to electrically connect the emitter electrode 107 to the n-type source layer 103. Such a "lattice" pattern is useful in maximizing a MOS channel width and reducing an ON-resistance in the resultant device.

In the case of the IGBT shown in FIG. 13, however, an increase in the MOS channel width leads to a rise of saturation current $I_{cp}$, which in turn causes a reduction in durability against load short-circuit.

As will be recognized, the trench IGBT shown in FIG. 13 should have the lattice-shaped n-type source pattern to reduce the ON-voltage, and this results in the saturation current $I_{cp}$ being raised to eventually decrease the durability against short-circuit.

BRIEF SUMMARY OF THE INVENTION

According to an embodiment of the invention, there is provided a semiconductor device comprising a base layer of a first conductivity type, a base layer of a second conductivity type created over the base layer of the first conductivity type, trenches each defined to penetrate the base layer of the second conductivity type and reach the base layer of the first conductivity type, a source layer of the first conductivity type selectively formed in the base layer of the second conductivity type, a channel layer of the second conductivity located between the base layer of the second conductivity and the trenches, having a higher impurity concentration level compared with the base layer of the second conductivity type, a gate insulation film covering inner wall surfaces of the trenches, gate electrodes located on the channel layer of the second conductivity type with an interposition of the gate insulation film between them, and a first primary electrode electrically connected to both the source layer of the first conductivity type and the base layer of the second conductivity type, and the channel layer of the second conductivity type has a generally uniform distribution of impurity concentration along depths of the trenches.

With the architecture as stated above, saturation current $I_{cp}$ can be reduced without a decrease in ON-resistance of the device so as to permit the device to have a sufficiently large durability against short-circuit.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Best modes of the present invention will be described in conjunction with the accompanying drawings. In the description hereinafter, although a vertical trench gate transistor is exemplified, the present invention should not be limited to that but is applicable to any semiconductor devices of MOS gate structures such as vertical trench IGBTs, lateral trench IGBTs, vertical trench MOSFETs, lateral trench MOSFETs, and the like. Also, in the description hereinafter, an example employing a combination of a first conductivity type for an n-type with a second conductivity type for a p-type will be explained.

First Embodiment

A basic trench MOS gate structure for a semiconductor device, or a first preferred embodiment of the present invention will be detailed.

Figure 1:
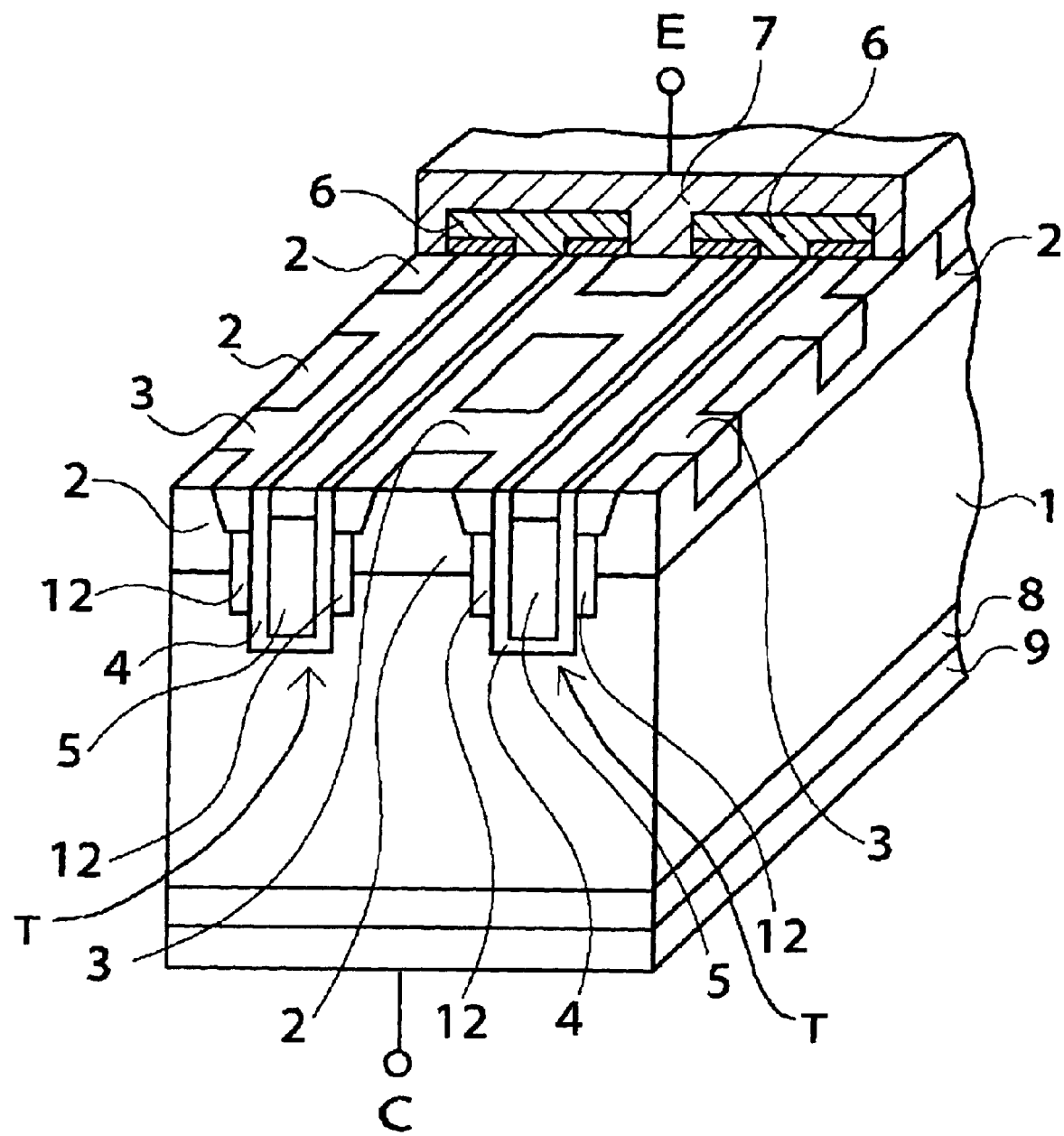
FIG. 1 is a perspective view showing a trench MOS gate structure of an exemplary semiconductor device according to an embodiment of the invention.

FIG. 1 is a partially cut-away perspective view showing a module of the trench MOS gate structure for the semiconductor device according to the embodiment of the invention.

The major part of the structure will now be described. First, a p-type base layer 2 is formed in an upper surface of an n-type base layer 1, and an n-type source layer 3 is selectively formed in the resultant surface. Additionally, a gate insulation film 4 is created over inner wall surfaces of trenches T for MOS gates, and the trenches T have their remaining spaces embedded with gate electrodes 5. The trenches T have their respective tops covered with insulation film 6, and it is further superposed with an emitter electrode 7. In the reverse or bottom side of the device, a collector electrode 9 is formed to underlie a p-type emitter layer 8.

Figure 13:
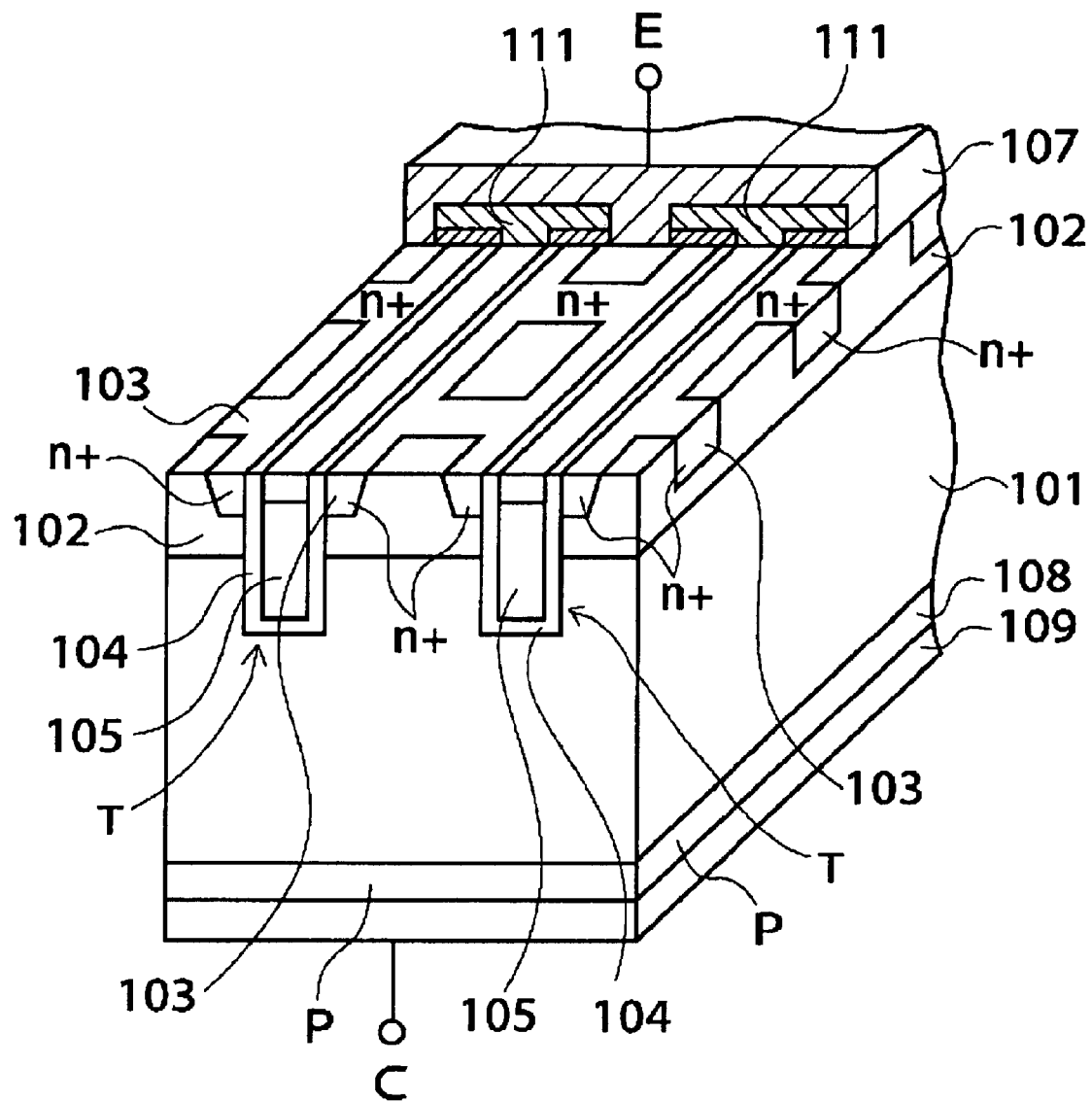
FIG. 13 is a perspective view showing the vertical IGBT of a trench gate structure prepared by the Inventor of the present invention in the course of attaining the present invention.

This embodiment of the semiconductor device is significantly different from the configuration shown in FIG. 13 in that a p-type channel layer is created in MOS channel regions adjacent to each of side walls of the trenches T. The p-type channel layer 12 has a higher impurity concentration, compared with the p-type base layer 2, and a distribution of the concentration throughout the channel layer is uniform along inner side walls of the trenches T.

Figure 2:
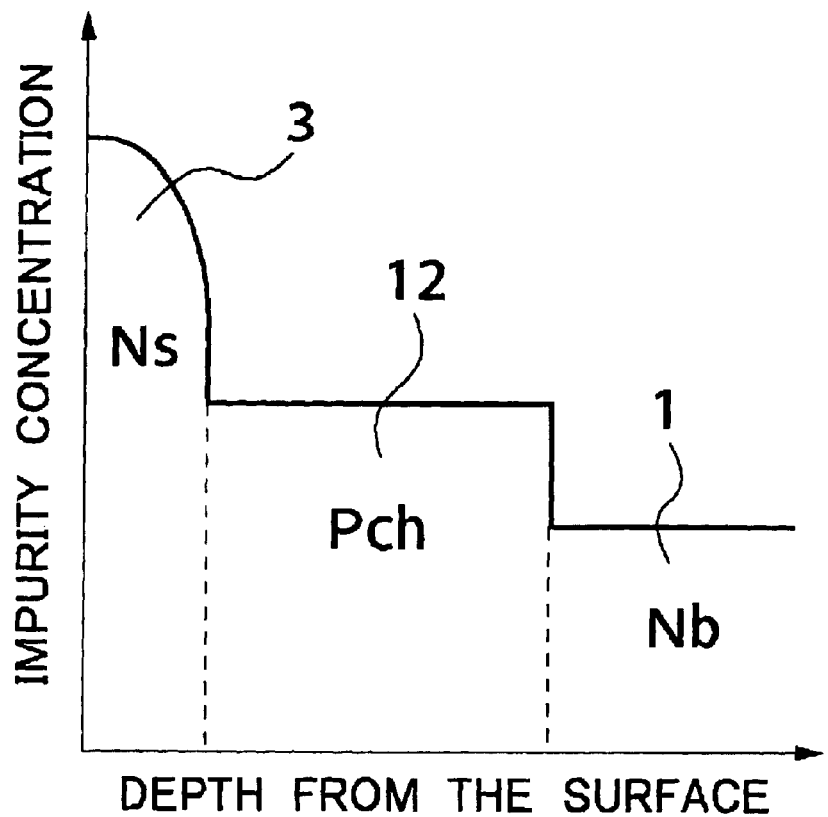
FIG. 2 is a graph showing a distribution of impurity concentration along depths of trenches T.

FIG. 2 is a graph showing a distribution of impurity concentration along depths of the trenches T. A lateral axis of the graph represents a distance from an opening level of the tops of the trenches T down to deeper portions thereof along the side walls while a vertical axis of the graph represents an impurity concentration. In this graph, Nb, Pch, and Ns respectively denote concentration distributions of n-type impurities in the n-type base layer 1, p-type impurities in the p-type channel layer 12, and n-type impurities in the n-type source layer 3.

As can be seen in FIG. 2, the concentration of impurities contained in the p-type channel layer 12 extending downward along the side walls of the trenches is almost uniform throughout the channel layer, and a uniform profile of the impurity concentration is exhibited.

Figure 3:
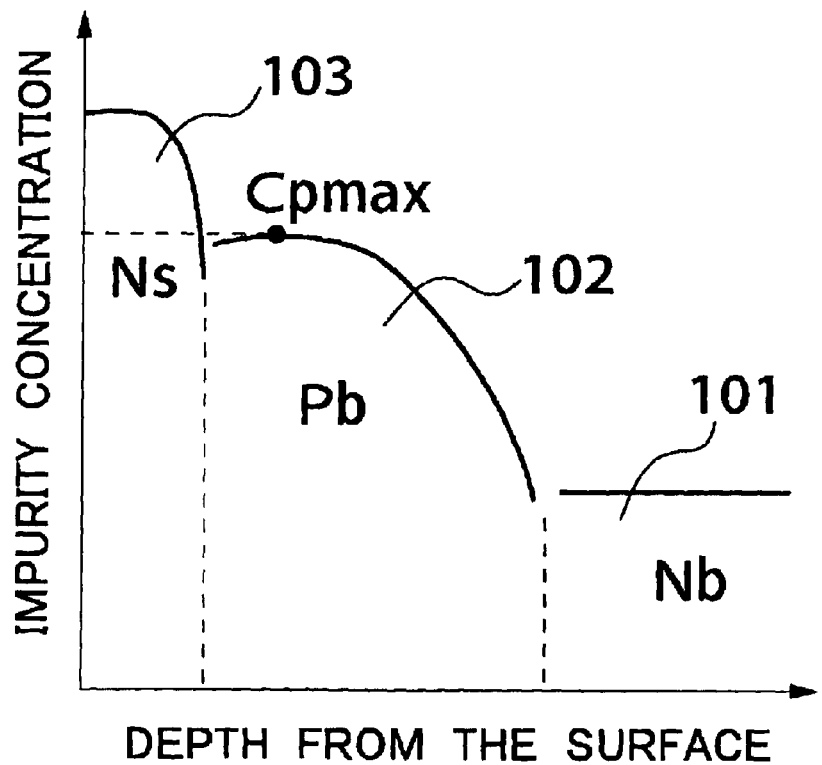
FIG. 3 is a graph showing a distribution of impurity concentration along depths of trenches T in the semiconductor device shown in FIG. 13 as a comparative example.

FIG. 3 is a graph showing a distribution of impurity concentration along depths of the trenches T in the semiconductor device shown in FIG. 13 as a comparative example. In the device shown in FIG. 13, the p-type base layer 102 and the n-type source layer 103 are created by diffusing impurities into substrate surfaces under appropriate heat control. Thus, a peak value ($Cp_{max}$) of the impurity concentration of the p-type base layer 102 is observed around a junction of the n-type source layer 102 to the p-type base layer 102 while the concentration of the p-type impurities is reduced as a measurement point is closer to a junction of the p-type base layer 102 to the n-type base layer 101.

When the IGBT of such a trench gate structure experiences load short-circuit, supply voltage is applied to the collector electrode 9 (109) of the device under ON-state. This allows short-circuit peak current $I_{cp}$ to flow in the device, and resultantly, the continuous ON-state under that condition for longer than a certain period of time $t_{sc}$ causes the device to be thermally broken down.

Thus, in order to avoid thermal break-down of the device, the short-circuit peak current $I_{cp}$ must remain sufficiently low.

On the contrary, the IGBT of the embodiment of the invention shown in FIG. 1 enables the short-circuit peak current $I_{cp}$ to decrease while keeping its ON-resistance sufficiently low, so that a durability against short-circuit can be enhanced. The principle will be described below.

In the IGBT of the structure as exemplified in FIG. 13, threshold voltage depends upon a dominant factor of the impurity concentration of the p-type base layer 102. Specifically, in the course of applying positive voltage to the gate electrode 105 relative to the emitter electrode 107, the applied voltage, when reaching the threshold voltage or even higher, causes the p-type base layer 102 in the channel region to turn to be an inverted layer, and this enables the device to turn on. Thus, the threshold voltage depends upon the distribution of the impurity concentration in the p-type base layer 102.

In accordance with the embodiment of the invention, as recognized in FIG. 2, the concentration distribution of the p-type impurities that dominates the threshold voltage is represented as a concentration distribution Pch in the p-type channel layer 12, being thoroughly uniform. It should be noted that the threshold voltage depends upon the entire region of the p-type channel layer 12. In contrast, referring to FIG. 3, when a concentration distribution Pb of the p-type impurities is not uniform, the threshold voltage is dominated by a region having a peak value of $Cp_{max}$.

As the ON-state IGBT has its collector voltage ($V_{ce}$) raised, an electric potential of the p-type base layer 2 first rises in the junction with the n-type base layer 1 among other areas, and when it reaches the threshold voltage or higher, the acquired inverted layer cannot be retained any further. In such a condition, the potential is at pinch-off voltage to have the current flowing in the device at a saturation level.

As shown in FIG. 2, when the concentration distribution Pch of the p-type impurities is uniform, the device is saturated with current upon a raise of potential up to the threshold level or higher around the junction with the n-type base layer 1. In contrast, as in FIG. 3, when the concentration distribution Pb of the p-type impurities is not uniform, the device is saturated with current upon a raise of potential up to the threshold level or higher around the junction with the n-type source layer 3 (around an area having a value $Cp_{max}$).

Assuming that both the IGBTs in FIGS. 1 and 13 have the same threshold voltage, voltage $V_{pinch}^1$ at which the device in FIG. 1 according to the embodiment of the invention is saturated with current flowing therein is lower than voltage $V_{pinch}$ at which the comparative device in FIG. 13 is saturated.

Figure 4:
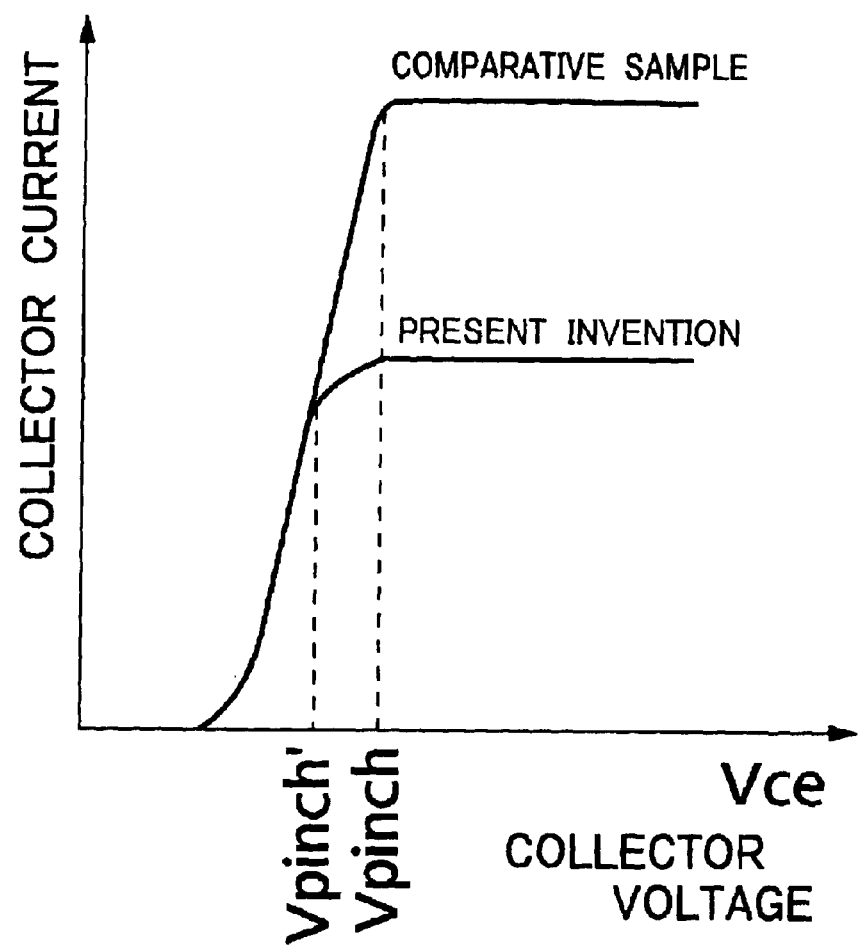
FIG. 4 is a graph showing properties on saturation current in an IGBT of FIG. 1 (embodiment of the invention) and FIG. 13 (comparative example), respectively.

FIG. 4 is a graph showing saturation current properties of both the IGBTs in FIGS. 1 (embodiment of the invention) and 13 (comparative example). Since the collector voltage $V_{ce}$ at which the device of the embodiment of the invention is saturated is lower than the corresponding voltage at which the comparative device is saturated, the former device has a lower saturation current $I_{cp}$, compared to the latter. For general understanding, when the concentration of the n-type impurities in the n-type base layer 1 is low, and when the gate insulation film 4 is thin, the saturation current $I_{cp}$ and the saturation voltage $V_{pinch}$ are related as follows:

$$I_{cp} \propto V_{pinch}^2$$

Thus, in accordance with the embodiment of the invention, creating the p-type channel layer 12 in the channel region adjacent to the side walls of the trenches as shown in FIG. 1, the saturation current $I_{cp}$ of the IGBT can be reduced without any alteration in its ON-resistance.

The width and location of the p-type channel layer 12 extending along the depth of the trench T is not limited to the aforementioned case where the p-type channel layer 12 extends downward from the n-type source layer 3 beyond the bottom of the p-type base layer 2.

Figure 5A:
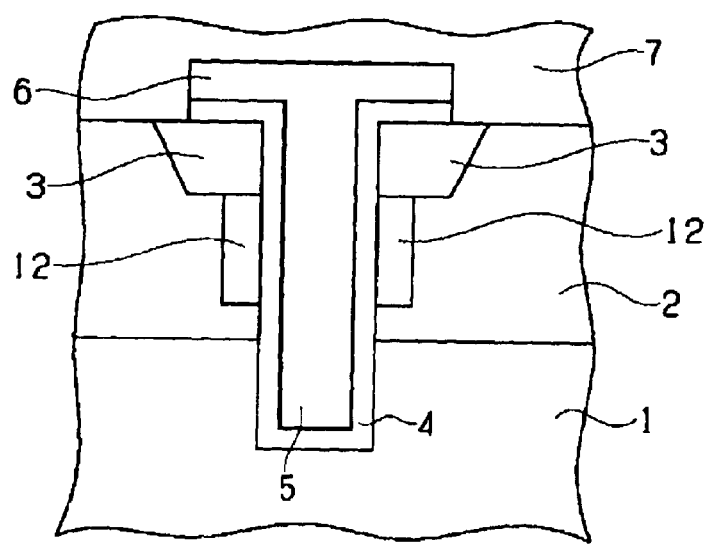
FIGS. 5A through 5C illustrate exemplary modules where a width and location of a p-type channel layer 12 are shown.
Figure 5B:
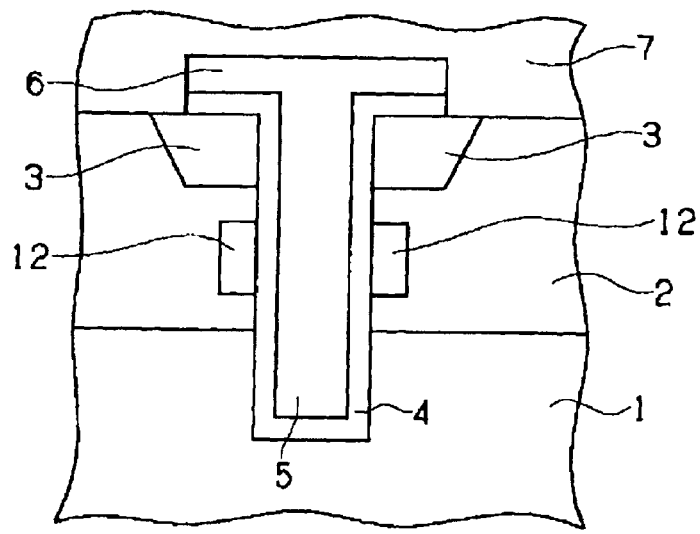
Figure 5C:
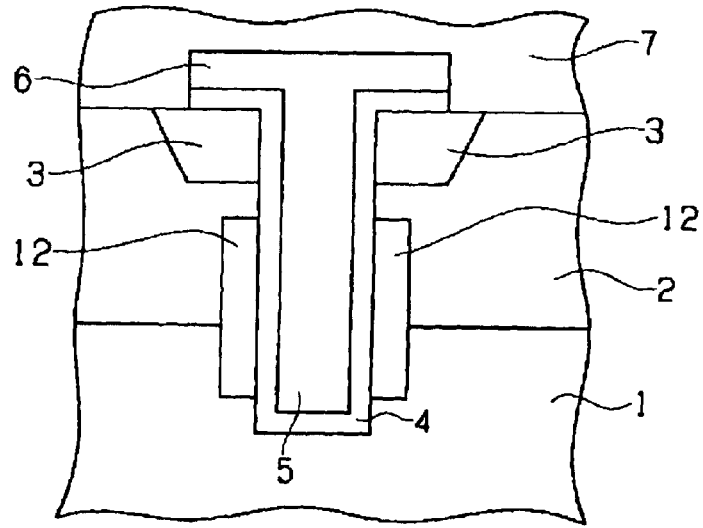

FIGS. 5A through 5C illustrate modules where a width and location of the p-type base layer 2 are shown.

In an example shown in FIG. 5A, the p-type channel layer 12 extends downward from the n-type source layer 3 and terminates at a level above the bottom of the p-type base layer 2.

In another example shown in FIG. 5B, the p-type channel layers 12 is partially located between the trench T and the p-type base layer 2. Specifically, the p-type channel layer 12 partially isolates the p-type base layer 2 from the side walls of the trench T.

In an additional example shown in FIG. 5C, the p-type channel layer 12 extends around the boundary between the p-type base layer 2 and the n-type base layer 1 up to and down to certain depths into both of the layers. The p-type channel layer 12 partially isolates the n-type base layer 1 and the p-type base layer 2 from the side walls of the trench T.

Any one of the cases shown in FIGS. 5A to 5C attains the desired effect of reduced saturation current.

Second Embodiment

A manufacturing method of the first embodiment of the semiconductor device, namely, a second preferred embodiment of the invention, will now be described.

Figure 6:
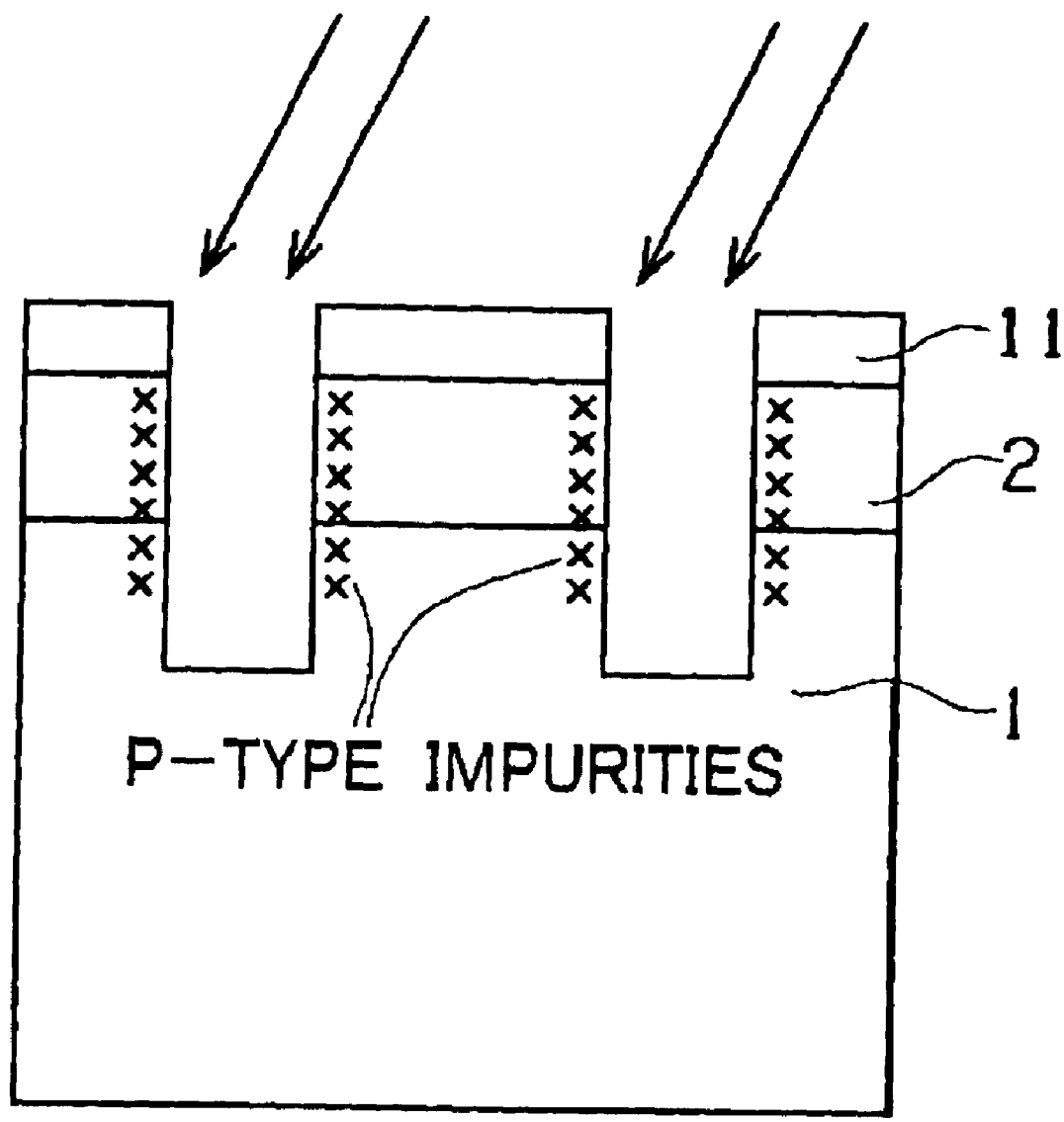
FIG. 6 is a cross-sectional view illustrating major stages of a manufacturing process of the semiconductor device shown in FIG. 1.

FIG. 6 is a cross-sectional view showing major stages of the exemplary manufacturing method; that is, FIG. 6 shows a process of producing the p-type channel layer 12.

In manufacturing the semiconductor device shown in FIG. 1, after the p-type base layer 2 is first formed by diffusing impurities in the substrate of the n-type base layer 1, a mask insulation film 11 is selectively deposited over the surface of the p-type base layer 2 for patterning to form the trenches T.

After that, the trenches T are defined and cleared down to the n-type base layer 1, and the p-type impurities (e.g., boron) are implanted into the side walls of the trenches. During the procedure, the wafer is tilted while impurity ions are introduced; that is, the ions are implanted at slant angle. In such a case, varying the angle at which the wafer is tilted enables control of a depth which the introduced impurities reach. Then, the introduced impurities are activated under thermal control so as to produce the p-type channel layer 12.

Although the width of the p-type channel layer 12 extending downward along the depth of the trench T is exemplified in a case of FIG. 6 as reaching a deeper level beyond the p-type base layer 2, it may be at a level above the bottom of the p-type base layer 2, as mentioned above in relation with the Embodiment 1, to obtain the same effect of reduced saturation current.

Third Embodiment

Another exemplary method of producing the p-type channel layer 12 will now be described.

Figure 7A:
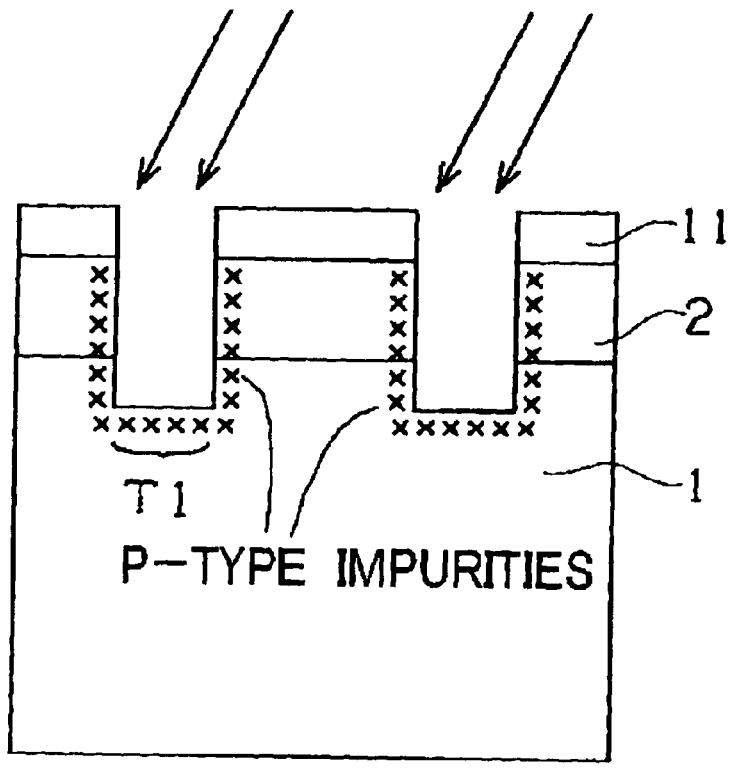
FIGS. 7A and 7B are cross sectional views illustrating major stages of a manufacturing process of a p-type channel layer 12 in the third embodiment of the invention.
Figure 7B:
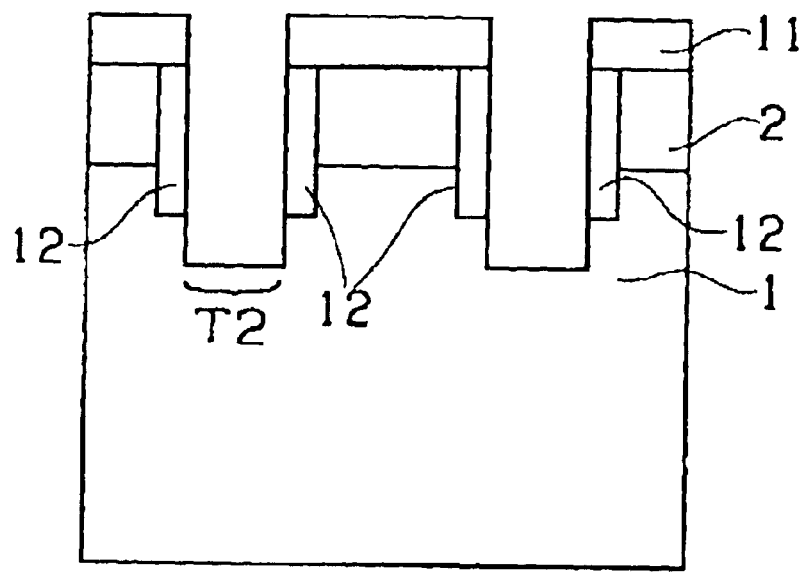

FIGS. 7A and 7B are cross-sectional views showing major stages of an exemplary manufacturing process of the p-type channel layer 12.

In this embodiment, a stage of patterning with the mask insulation film 11 and any of preceding stages thereto are similar to those in the Second Embodiment (see FIG. 6). In the succeeding stage, as shown in FIG. 7A, a shallow trench T1 is tunneled down to a depth at which the p-type channel layer 12 is to be formed, and thereafter, impurities are introduced by means of implantation at slant angle, vapor diffusion, solid state diffusion, or the like. As can be seen in FIG. 7B, the trench is further tunneled into a deeper trench T2, and undergoes a thermal control to create the p-type channel layer 12.

In the aforementioned way of the manufacturing process (Embodiment 2), the depth of the p-type channel layer 12 is regulated by implanting the impurities at slant angle. However, the ion implantation must be repeated after the wafer is rotated by 180 degrees while regulating the wafer at a predetermined orientation, and this makes the process annoying.

On the contrary, this embodiment (Third Embodiment) provides an improved impurity implantation of reduced process restrictions and enhanced manufacturing efficiency in that it can be performed by means of a simplified and easy procedure such as vapor diffusion and solid state diffusion, except for the twice repeated stage in forming the trenches.

Fourth Embodiment

Another embodiment of manufacturing the n-type source layer 3 will now be described.

The background of this embodiment is as follows: In the comparative example shown in FIG. 13, the n-type source layer 3 is produced by implanting n-type impurities into the surface of the p-type base layer 2. As mentioned before in conjunction with FIG. 13, the substrate must be masked as desired to shape the n-type source layer 3 into "lattice". However, there often arises a risk of "misalignment" of the pattern during the masking.

Figure 8A:
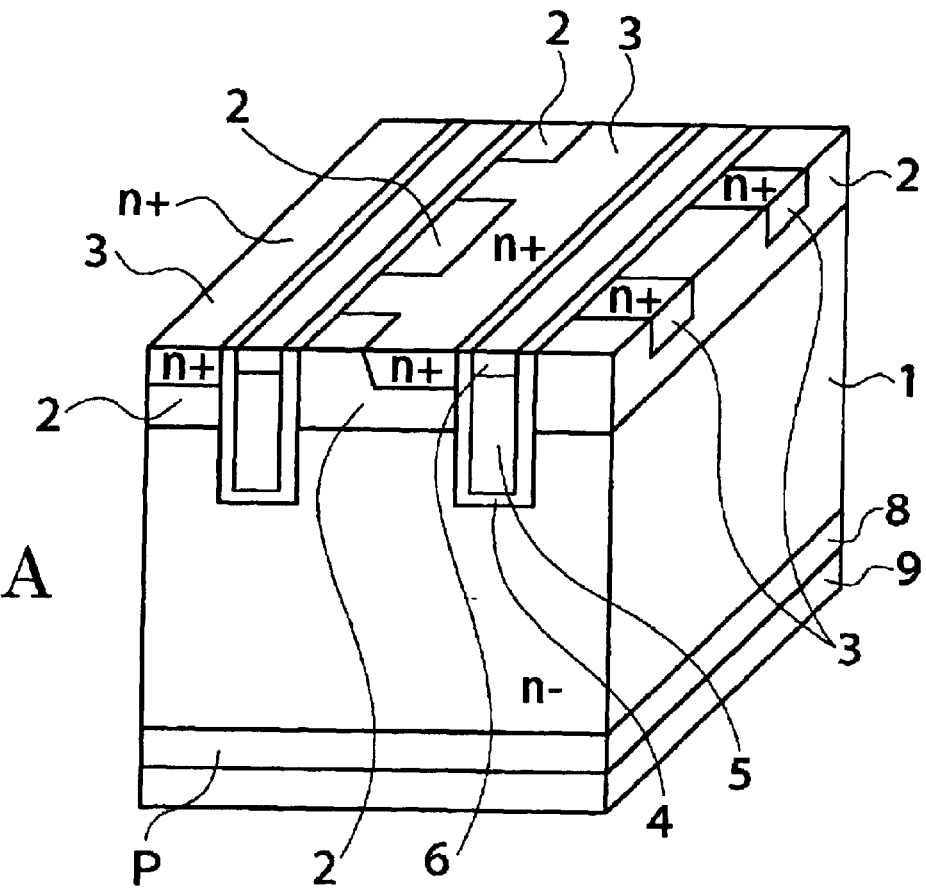
FIGS. 8A and 8B are conceptual diagrams explaining "misalignment" in patterning.
Figure 8B:
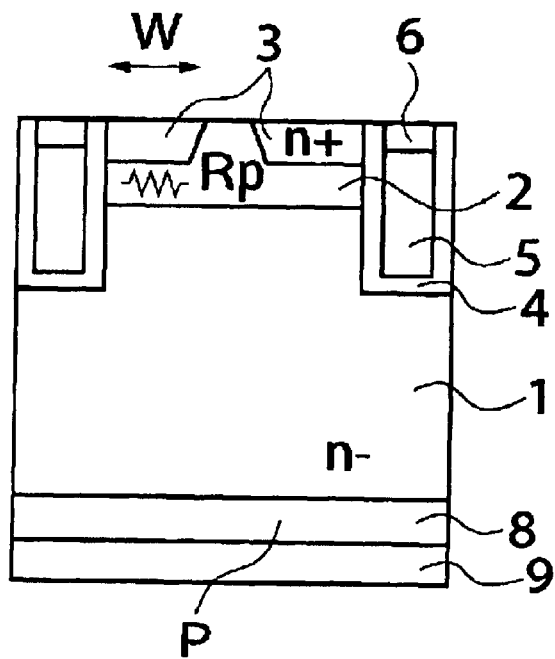

FIGS. 8A and 8B are conceptual diagrams given for explaining such "misalignment" in patterning. FIG. 8A illustrates a case where the n-type source layer 3 is deviated from a right location relative to the gate trench. When the "misalignment" in the patterning is caused in such a way, a width of the MOS channel is reduced, and consequently, the ON-resistance rises. Thus, as shown in FIG. 8B, in case of "misalignment", a margin for pattern alignment (a flat portion of the source layer 3) is provided so as to avoid a reduction of the channel width. However, there still arises another problem that an increased width w of the n-type source layer 3 for the margin causes an increase m base resistant $R_p$ right below the n-type source layer 3, and this also increases likeliness to raise a potential at the p-type base layer 2, which eventually decreases a durability against latch-up.

As will be recognized, this embodiment provides a manufacturing method that is effective in minimizing the width w of the n-type source layer 3 to enhance the durability against latch-up.

Figure 9A:
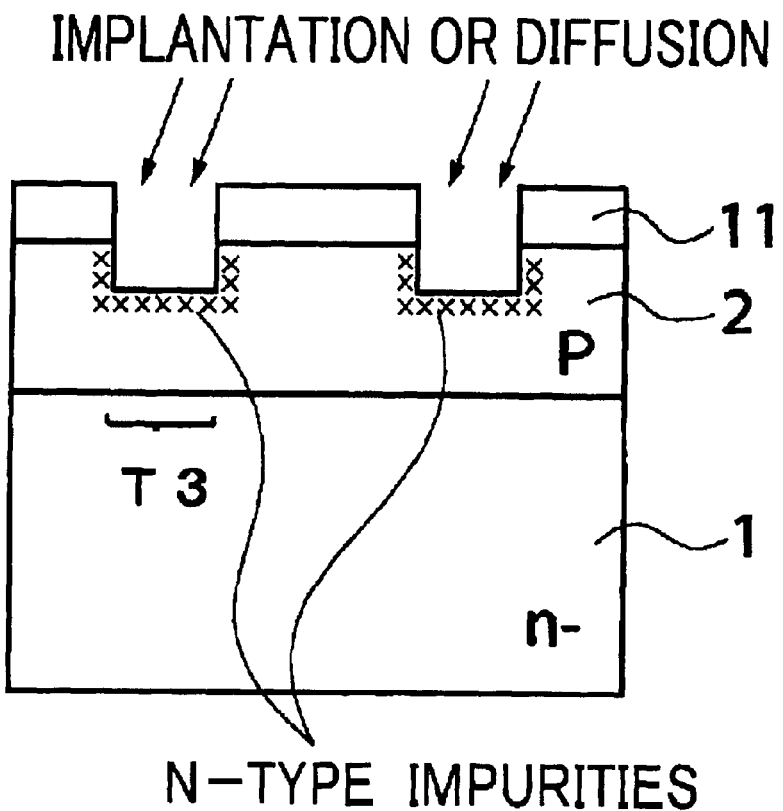
FIG. 9A is a cross-sectional view showing a manufacturing method of an n-type source layer 3 in the fourth embodiment of the present invention.

FIG. 9A is a cross-sectional view showing a manufacturing method of the n-type source layer 3 according to this embodiment.

Specifically, in this embodiment, as illustrated in FIG. 9A, a trench T3 is first tunneled down to a depth at which the n-type source layer 3 is to be formed, and thereafter, the n-type impurities are introduced into side walls of the trench T3 by means of implantation at slant angle, vapor diffusion, solid state diffusion, or the like. After that, the impurities are activated under thermal control to produce the n-type source layer 3 in a self-alignment manner.

Then, the manufacturing process illustrated in conjunction with FIG. 6 or FIG. 7 may be used to produce the p-type channel layer 12.

Thus, according to this embodiment, since the n-type source layer 3 can be produced in a self-alignment manner relative to the trenches, there is no need of providing a margin to avoid "misalignment". As a consequence, the width w of the n-type source layer 3 can be reduced, and the resultant enhancement of the durability against latch-up leads to a reduction of saturation current, which eventually brings about an improved IGBT having a considerably enhanced durability against short-circuit.

Also, according to the instant embodiment, since impurities are implanted into the side walls of the trenches to produce the n-type source layer 3, an impurity concentration of the n-type region 3 can be uniform at any point along depths of the trenches.

Figure 9B:
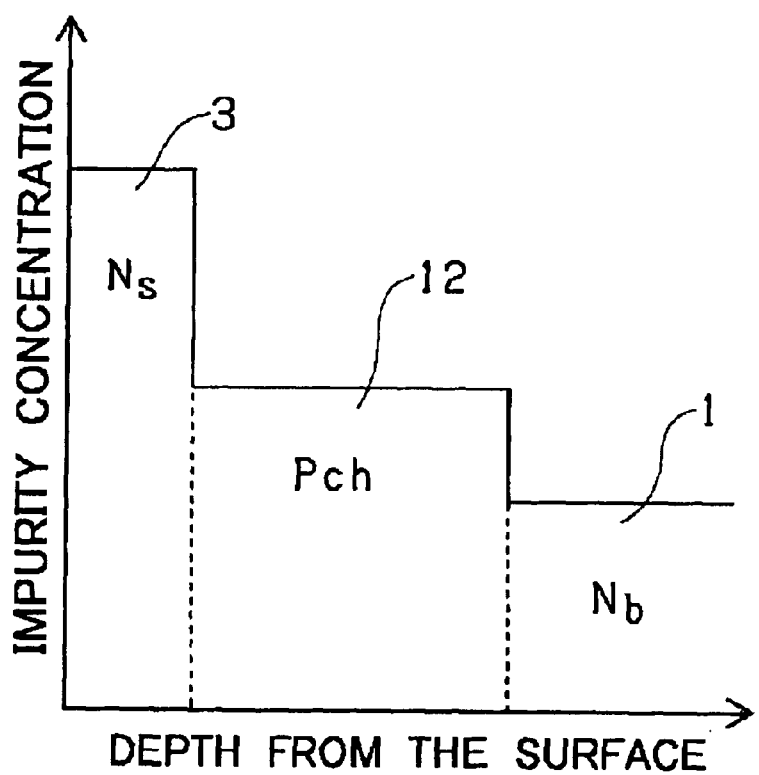
FIG. 9B is a graph showing a distribution of impurity concentration along side wall surfaces of the trenches T.

FIG. 9B is a graph illustrating a distribution of impurity concentration along the depths of the trenches T in the IGBT manufactured according to this embodiment. A lateral axis of the graph represents a distance from an opening level of the tops of the trenches T in FIG. 1 down to deeper portions thereof along the side walls while a vertical axis of the graph represents an impurity concentration. In this graph, Nb, Pch, and Ns respectively denote concentration distributions of n-type impurities in the n-type base layer 1, p-type impurities in the p-type channel layer 12, and n-type impurities in the n-type source layer 3.

As can be seen in FIG. 9B, the resultant uniform distribution of the impurity concentration in the n-type source layer 3 facilitates an operation voltage design in the device, and this allows a device of desired properties to be manufactured in a stable and ensured manner.

Fifth Embodiment

Another exemplary method of manufacturing the n-type source layer 3 will be described.

FIGS. 10A through 10D are cross-sectional views showing such a manufacturing method.

Figure 10A:
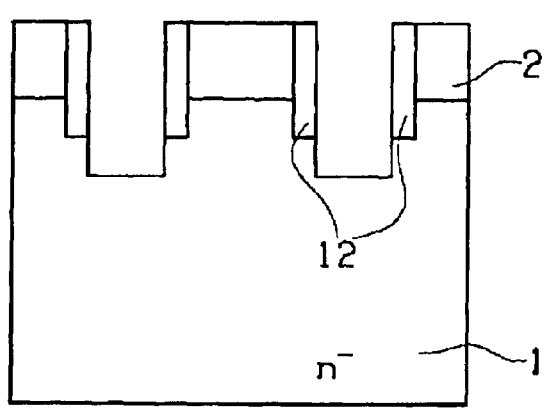
FIGS. 10A through 10D are cross-sectional views showing a manufacturing method of the n-type source layer 3 in one of the fifth embodiment of the invention.

In this embodiment, as shown in FIG. 10A, the p-type channel layer 12 is first produced. A means for the production is the same as those mentioned above in the Second and Third Embodiments (see FIGS. 6 and 7).

Figure 10B:
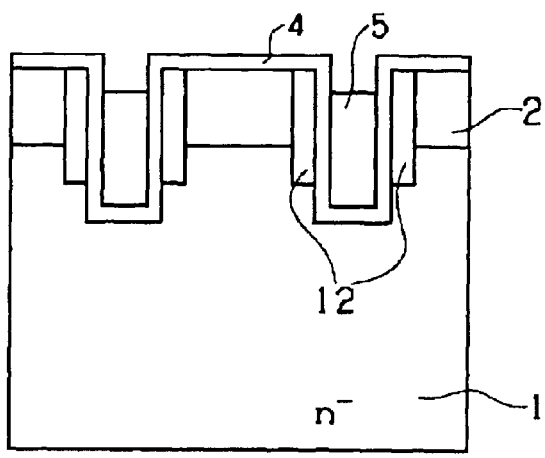

Next, as can be seen FIG. 10B, the gate structure is created. For instance, the gate insulation film 4 is created inner walls of the trenches T, and the trenches are embedded with the gate electrodes 5.

Figure 10C:
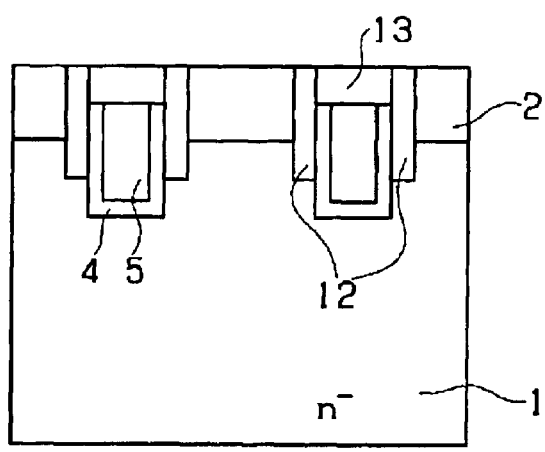

After that, as shown in FIG. 10C, the gate insulation film 4 is removed from the vicinity of the wafer surface, and an insulator layer 13 containing the n-type impurities (e.g., PSG film) is created at the tops of the trenches to bury the gate electrodes 5 therein.

Figure 10D:
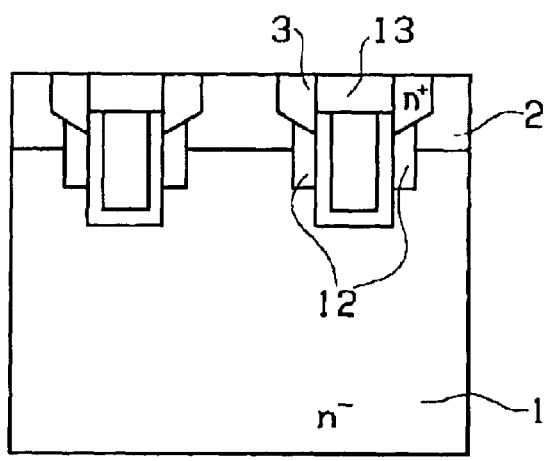

The n-type impurities in the insulator layer 13 is diffused (solid phase diffusion) to produce the n-type source layer 3 as shown in FIG. 10D.

In this embodiment, also, the n-type source layer 3 can be produced in a self-alignment manner relative to the trenches, and hence, there is no need of providing a margin to avoid "misalignment". As a consequence, the width w of the n-type source layer 3 can be reduced, and the resultant enhancement of the durability against latch-up leads to a reduction of saturation current, which eventually brings about an improved IGBT having a considerably enhanced durability against short-circuit.

Furthermore, this embodiment ensures and facilitates a control of the n-type source layer 3 extending downward along the depths of the trenches, and a prospective margin during the manufacturing process becomes wider.

Sixth Embodiment

Further another exemplary method of manufacturing the n-type source layer 3 will now be described.

Figure 11A:
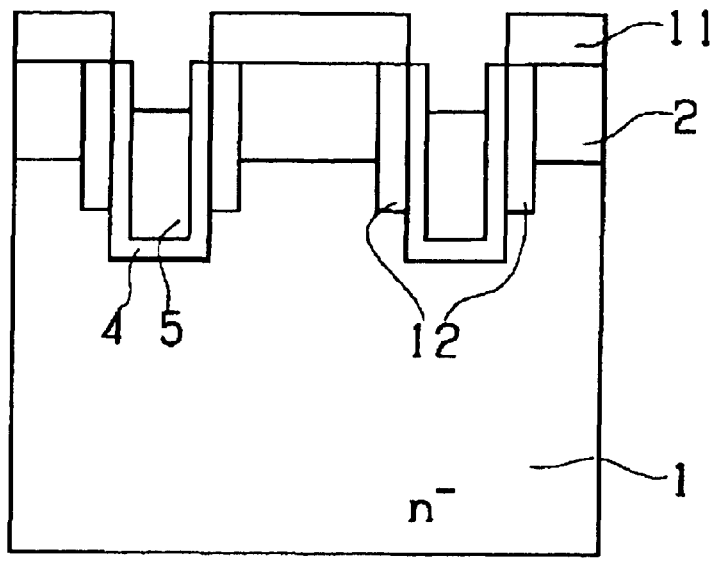
FIGS. 11A and 11B are cross-sectional views showing a manufacturing method of the n-type source layer 3 in the sixth embodiment of the invention.
Figure 11B:
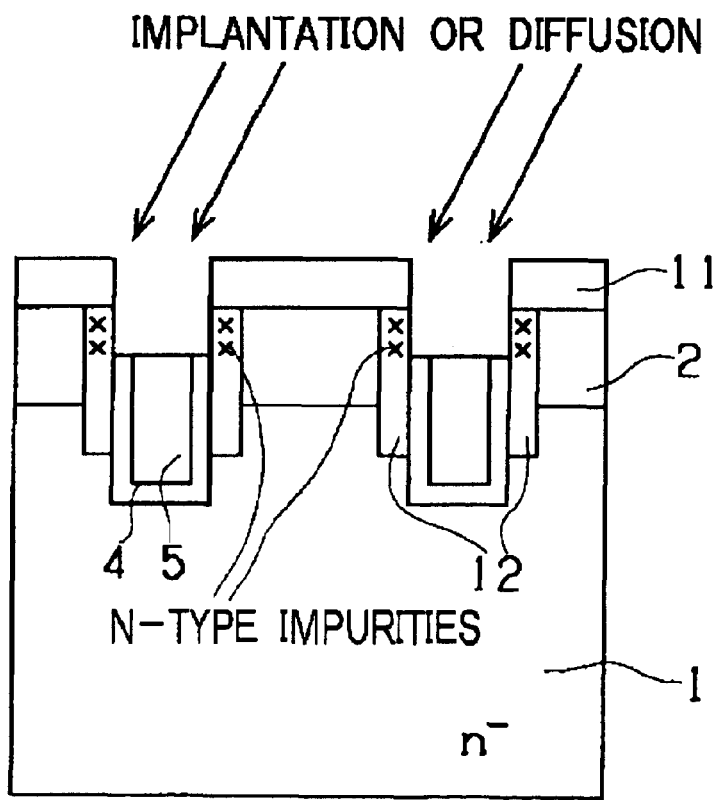

FIGS. 11A and 11B are cross-sectional views illustrating such a manufacturing method.

In this embodiment, first, as shown in FIG. 11A, the trenches are formed and embedded with the gate electrodes 5. This and preceding stages are the same as those in the Fifth Embodiment, except that the mask insulation film 11 is not peeled off at this time of the process.

Then, as shown in FIG. 11B, parts of the gate insulation film 4, which extend above the gate electrodes 5, are peeled off, and thereafter, the n-type impurities are introduced by means of implantation at slant angle, vapor diffusion, solid state diffusion, or the like. After that, the impurities are activated under thermal control to produce the n-type source layer 3.

In this embodiment, also, since the n-type source layer 3 can be created in a self-alignment manner relative to the trenches, there is no need of providing a margin to avoid "misalignment". As a consequence, the width w of the n-type source layer 3 can be reduced, and the resultant enhancement of the durability against latch-up leads to a reduction of saturation current, which eventually brings about an improved IGBT having a considerably enhanced durability against short-circuit.

Moreover, this embodiment ensures and facilitates a control of the n-type source layer 3 extending downward along the depths of the trenches, as well, and a prospective margin during the manufacturing process becomes wider.

Seventh Embodiment

Another exemplary method of manufacturing the emitter electrode 7 will now be described. In aforementioned Embodiments 4 to 6, the impurities are introduced into the side 15 walls of the trenches to produce the n-type source layer 3, and thus, the advantageous methods of manufacturing devices having enhanced durability against latch-up are provided. In conformity with them, this embodiment provides an improved manufacturing method where the emitter electrode 7 is also connected to the n-type source layer 3 at the side walls of the trenches.

If the width w of the n-type source layer 3 is reduced by any of the manufacturing methods described and depicted in Fourth through Sixth Embodiments and FIGS. 9A to 11B, the durability against latch-up is enhanced but a direct connection of the n-type source layer 3 to the emitter electrode 7 becomes difficult. Therefore, a "lattice" pattern as shown in FIG. 13 may be required. However, if a connection at the side walls of the trench is implemented, the "lattice" pattern is not required, and this further results in a reduction of a basic cell width in the device as well as an enhancement of a device property (with regard to ON-resistance).

Figure 12A:
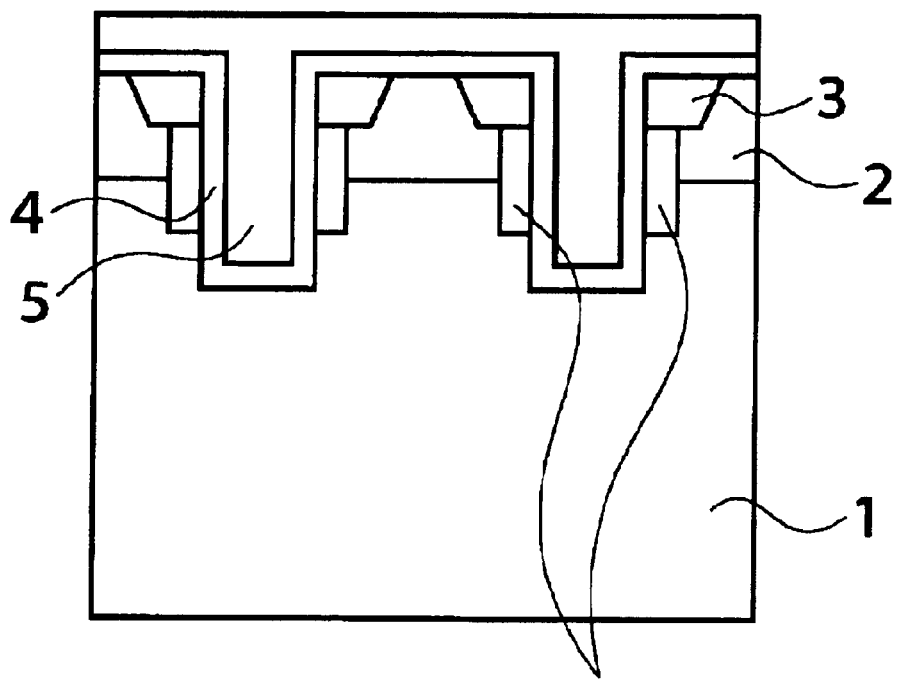
FIGS. 12A and 12B are cross-sectional views showing a manner of creating an emitter electrode 7 in the seventh embodiment of the invention.
Figure 12B:
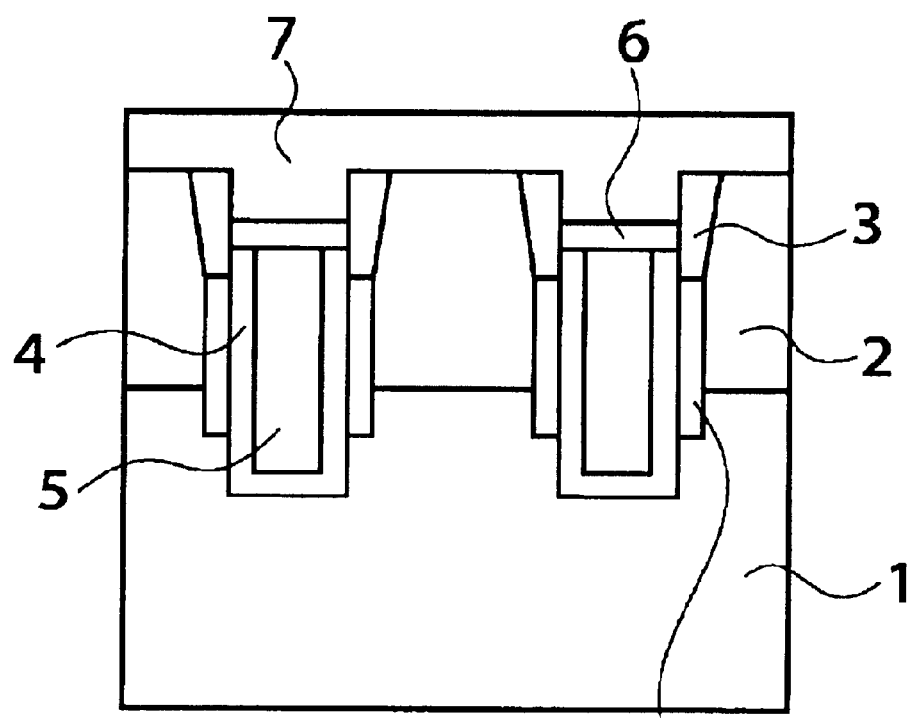

FIGS. 12A and 12B are cross-sectional views showing the method of forming the emitter electrode 7 according to this embodiment.

First, as shown in FIG. 12A, the trenches T are formed and embedded with the gate insulation film 4 and the gate electrode 5.

Next, as can be seen in FIG. 12B, after the gate electrodes 5 are partially eliminated to have their respective tops leveled down below the surface of the substrate, an interlayer insulation film 6 is formed. The gate insulation film 4 extending upward beyond the interlayer insulating film 6 is peeled off, and the surface of the substrate is filled and covered with the emitter electrode 7. In this manner, the emitter electrode 7 can connect to the P-type base layer 2 while being in contact with the n-type source layer 3 at the side walls of the trenches.

According to this embodiment, the "lattice" pattern as illustrated in FIG. 13 is unnecessary. Consequently, the cell width of the device can be reduced while a MOS channel width per unit area is increased, so as to reduce the ON-resistance.

The preferred embodiments of the invention have been described by way of example, and it should be understood that the present invention is not limited to these examples.

Dimensions, shapes, conductivity types, impurity concentrations, materials, etc. of components in each of the preferred embodiments include not only those set forth herein but also those which are well known to and selectively recognized by any person having ordinary skills in the art as having similar effects to those taught herein in relation with the embodiments of the invention.

As has been described in details, in accordance with any embodiment of the invention, providing the channel layers adjacent to the side walls of the trenches permits the device of the trench MOS structure to have a reduced saturation current without an increase in the ON-resistance, thereby attaining an enhanced durability against short-circuit.

Additionally, according to any embodiment of the present invention, the n-type source layer is formed in a self-alignment manner, and the emitter electrode is connected to the n-type source layer at the side walls of the trenches, whereby the basic cell structure of the device can be reduced, and the ON-resistance also can be reduced.

Thus, the embodiments of the present invention ensure and facilitate production of the high performance semiconductor device having trench gates, and it offers a large amount of benefit in this point to the industry.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising, a base layer of a first conductivity type;

a base layer of a second conductivity type provided on the base layer of the first conductivity type;

trenches each defined to penetrate the base layer of the second conductivity type and reach the base layer of the first conductivity type;

a source layer of the first conductivity type selectively formed in the surface of the base layer of the second conductivity type;

a channel layer of the second conductivity type located between the base layer of the second conductivity and the trenches, having a higher impurity concentration level compared with the base layer of the second conductivity type;

a gate insulation film covering inner wall surfaces of the trenches;

gate electrodes each located on the channel layer of the second conductivity type with an interposition of the gate insulation film between them; and a first primary electrode electrically connected to both the source layer of the first conductivity type and the base layer of the second conductivity type, the channel layer of the second conductivity type having a generally uniform distribution of impurity concentration along depths of the trenches.

2. A semiconductor device according to claim 1, wherein the channel layer of the second conductivity type is connected to the source layer of the first conductivity type and extends downward beyond the base layer of the second conductivity type along the depths of the trenches.

3. A semiconductor device according to claim 1, wherein the channel layer of the second conductivity type is connected to the source layer of the first conductivity type and extends down to a level above the bottom of the base layer of the second conductivity type along the depths of the trenches.

4. A semiconductor device according to claim 1, wherein the channel layer of the second conductivity type is apart from the source layer of the first conductivity type and extends down to a level above the bottom of the base layer of the second conductivity type along the depths of the trenches.

5. A semiconductor device according to claim 1, wherein the channel layer of the second conductivity type is apart from the source layer of the first conductivity type and extends downward beyond the base layer of the second conductivity type along the depths of the trenches.

6. A semiconductor device according to claim 1, wherein the source layer of the first conductivity type has a generally uniform distribution of impurity concentration along the depths of the trenches.

7. A semiconductor device according to claim 1, wherein part of the first primary electrode occupy a space over the insulation film formed on the gate electrode in each of the trenches and is electrically connected to the source layer of the first conductivity type at the side walls of the trench.

8. A semiconductor device according to claim 1, further comprising an insulator layer which overlies the gate electrode in each of the trench and contains impurities of the first conductivity type, the impurities of the first conductivity type being diffused from the insulator layer into the source layer of the first conductivity type, so that the source layer has a generally uniform impurity concentration along the depth of the trench.

9. A semiconductor device comprising, a base layer of a first conductivity type;

a base layer of a second conductivity type provided on the base layer of the first conductivity type;

a trench defined to penetrate the base layer of the second conductivity type and reach the base layer of the first conductivity type;

a source layer of the first conductivity type selectively formed in the surface of the base layer of the second conductivity type;

a channel layer of the second conductivity type located on a outer wall surfaces of the trench, having a higher impurity concentration level compared with the base layer of the second conductivity type;

a gate insulation film covering inner wall surfaces of the trench; and gate electrode located inside the trench, the channel layer of the second conductivity type having a generally uniform distribution of impurity concentration along depth of the trench.

10. A semiconductor device according to claim 9, wherein the channel layer of the second conductivity type is connected to the source layer of the first conductivity type and extends down to a level above the bottom of the base layer of the second conductivity type along the depth of the trench.

11. A semiconductor device according to claim 9, wherein the channel layer of the second conductivity type is apart from the source layer of the first conductivity type and extends down to a level above the bottom of the base layer of the second conductivity type along the depth of the trench.

12. A semiconductor device according to claim 9, wherein the channel layer of the second conductivity type is apart from the source layer of the first conductivity type and extends downward beyond the base layer of the second conductivity type along the depth of the trench.

13. A method of manufacturing a semiconductor device which includes a base layer of a first conductivity type, a base layer of a second conductivity type provided on the base layer of the first conductivity type, trenches each defined to penetrate the base layer of the second conductivity type and reach the base layer of the first conductivity type, a source layer of the first conductivity type selectively formed in the surface of the base layer of the second conductivity type, a channel layer of the second conductivity type located between the base layer of the second conductivity type and the trenches, having a higher impurity concentration level compared with the base layer of the second conductivity type, a gate insulation film covering inner wall surfaces of the trenches, and gate electrodes each located on the channel layer of the second conductivity type with an interposition of the gate insulation film between them, the method comprising:

forming the base layer of the first conductivity type;

forming the base layer of the second conductivity type on the base layer of the first conductivity type;

forming the trenches in the base layer of the second conductivity type; and introducing impurities of the second conductivity type from the side walls of the trenches to form the channel layer of the second conductivity type, the channel layer of the second conductivity type having a generally uniform distribution of impurity concentration along depths of the trenches.

14. A method of manufacturing a semiconductor device according to claim 13, wherein the step of forming the trenches includes tunneling the trenches down to a depth at which the channel layer of the second conductivity type is to be formed, and the step of forming the channel layer of the second conductivity type includes tunneling the trenches further deeper into the base layer of the first conductivity type after introducing the impurities of the second conductivity type.

15. A method of manufacturing a semiconductor device according to claim 13, wherein the step of forming the trenches includes tunneling the trenches down to a depth at which the source layer of the first conductivity type is to be created, and introducing impurities of the first conductivity type from the side walls of the trenches to form the source layer of the first conductivity type.

16. A method of manufacturing a semiconductor device according to claim 14, wherein the step of forming the trenches includes tunneling the trenches down to a depth at which the source layer of the first conductivity type is to be created, and introducing impurities of the first conductivity type from the side walls of the trenches to form the source layer of the first conductivity type.

17. A method of manufacturing a semiconductor device according to claim 13, further comprising:

forming the gate electrodes in the trenches with an interposition of the gate insulation film between them;

eliminating part of the gate electrodes to level them down below the surface of the base layer of the second conductivity type;

forming an insulator layer containing the impurities of the first conductivity type on the gate electrode in each of the trench; and diffusing the impurities of the first conductivity type from the insulator layer into the base layer of the second conductivity type to form the source layer of the first conductivity type.

18. A method of manufacturing a semiconductor device according to claim 13, further comprising:

forming the gate electrodes in the trenches with an interposition of the gate insulating film between them;

eliminating part of the gate electrodes to level them down below the surface of the base layer of the second conductivity type; and introducing the impurities of the first conductivity type from the side walls of the trenches to form the source layer of the first conductivity type.

19. A method of manufacturing a semiconductor device according to claim 13, further comprising:

forming the gate electrodes in the trenches with an interposition of the gate insulation film between them;

eliminating part of the gate electrodes to level them down below the surface of the base layer of the second conductivity type;

forming an interlayer insulation film over the gate electrodes;

removing the gate insulation film exposed on or above the interlayer insulation film in the trenches; and making the first primary electrode occupy the remaining spaces in the trenches to create electrical contacts with the source layer of the first conductivity type.

20. A method of manufacturing a semiconductor device according to claim 13, wherein the step of forming the channel layer of the second conductivity type includes implanting impurity ions of the second conductivity type into vertical extensions of the trenches at a slant angle.

21. A method of manufacturing a semiconductor device according to claim 13, wherein the step of forming the channel layer of the second conductivity type includes introducing the impurities of the second conductivity type by means of vapor diffusion or solid phase diffusion.

* * * * *